United States Patent
Morishige et al.

(10) Patent No.: US 7,166,167 B2
(45) Date of Patent: Jan. 23, 2007

(54) LASER CVD DEVICE AND LASER CVD METHOD

(75) Inventors: Yukio Morishige, Tokyo (JP); Atsushi Ueda, Tokyo (JP)

(73) Assignee: Laserfront Technologies, Inc., Kanagawa (JP)

( * ) Notice: Subject to any disclaimer, the term of this patent is extended or adjusted under 35 U.S.C. 154(b) by 101 days.

(21) Appl. No.: 10/600,075

(22) Filed: Jun. 20, 2003

(65) Prior Publication Data

US 2004/0011289 A1   Jan. 22, 2004

(30) Foreign Application Priority Data

Jun. 25, 2002   (JP)   .............................. 2002/185160

(51) Int. Cl.
  *C23C 16/02*   (2006.01)
  *C23C 16/48*   (2006.01)

(52) U.S. Cl. ................................ 118/722; 118/723 MP; 118/725; 118/729; 156/345.35; 156/345.38

(58) Field of Classification Search ................ 118/722, 118/725, 723 MP, 719, 729; 156/345.35, 156/345.38
See application file for complete search history.

(56) References Cited

U.S. PATENT DOCUMENTS

| | | | | |
|---|---|---|---|---|
| 4,123,316 A | * | 10/1978 | Tsuchimoto | ................. 438/731 |
| 4,278,493 A | * | 7/1981 | Petvai | .................... 204/192.32 |
| 4,381,453 A | * | 4/1983 | Cuomo et al. | ............... 250/398 |
| 4,716,491 A | * | 12/1987 | Ohno et al. | .................. 361/230 |
| 4,801,352 A |   | 1/1989 | Piwczyk | |
| 5,108,535 A | * | 4/1992 | Ono et al. | .............. 156/345.35 |
| 5,182,231 A | * | 1/1993 | Hongo et al. | ................. 438/598 |
| 5,563,095 A | * | 10/1996 | Frey | .............................. 438/62 |
| 5,803,974 A | * | 9/1998 | Mikoshiba et al. | ... 118/723 MP |
| 6,137,231 A | * | 10/2000 | Anders et al. | ........... 315/111.21 |
| 6,419,752 B1 | * | 7/2002 | Shvets et al. | ................ 118/720 |

FOREIGN PATENT DOCUMENTS

| | | |
|---|---|---|
| JP | 63-060270 | 3/1988 |
| JP | 63-65077 | 3/1988 |
| JP | 63-164240 | 7/1988 |
| JP | 64-47032 | 2/1989 |
| JP | 3-166376 | 7/1991 |
| JP | 2000-109979 | 4/2000 |

OTHER PUBLICATIONS

Taiwan Office Action dated Feb. 15, 2005, together with an English Translation.

* cited by examiner

*Primary Examiner*—Richard Bueker
(74) *Attorney, Agent, or Firm*—Scully, Scott, Murphy & Presser, P.C.

(57) ABSTRACT

A laser CVD device capable of tightening adhesion of a film formed by laser CVD to a film formation face of a substrate and preventing cracks from occurring in the film itself is to be provided. The device comprises a plasma pretreating unit for turning pretreating gas into a plasma state by arc discharge and for supplying the plasma sate gas to the film formation face; and a film forming unit having means for sealing film forming gas while being isolated from an external atmosphere, means for radiating a laser beam to the film forming gas, wherein the film is formed over the film formation face of the substrate.

2 Claims, 6 Drawing Sheets

LASER CVD DEVICE AND LASER CVD METHOD

BACKGROUND OF THE INVENTION

1. Field of the Invention

The present invention relates to a laser chemical vapor deposition (CVD) device and a laser CVD method, which are applied for correcting deficiencies (defects) in photomask patterns and for correcting deficiencies in wiring or insulating patterns formed over the substrate of a liquid crystal display device.

2. Description of the Related Art

Conventionally, laser CVD devices and laser CVD methods are used for permitting selective film formation in infinitesimal areas and, more particularly, are well known to be applied for correcting deficiencies in photomask patterns and deficiencies in wiring or insulating films formed over the substrate of a liquid crystal display device.

Such laser CVD devices and methods are described in the Japanese Patent Application Laid-open No.63-164240, the Japanese Patent Application Laid-open No.63-65077, the Japanese Patent Application Laid-open No.64-47032, the Japanese Patent Application Laid-open No.3-166376 and the U.S. Pat. No. 4,801,352.

Of these, all of the laser CVD methods described in the Japanese Patent Application Laid-open No.63-164240, the Japanese Patent Application Laid-open No. 63-65077, the Japanese Patent Application Laid-open No. 64-47032 laser CVD method and the Japanese Patent Application Laid-open No. 3-166376 are carried out in a reduced-pressure chamber. By contrast, the laser CVD method disclosed in the U.S. Pat. No. 4,801,352 is performed in the atmosphere.

Today, when substrates over which films are to be formed have significantly increased in size, the laser CVD device and method described in the U.S. Pat. No. 4,801,352 can be considered useful because, unlike other known devices, it requires no chamber in which the substrate over which a film is to be formed is accommodated and the pressure is reduced. Therefore the laser CVD device of the U.S. Patent needs no large size equipment, and moreover can increase the throughput. However, when the laser CVD device described in the U.S. Patent is used, as the film formation face of the substrate is exposed to the atmosphere before a film is formed thereon, there is a fear that the film formed may come off the substrate face. Particularly, when the device is applied for correcting deficiencies in photomask patterns and deficiencies in wiring or insulating films formed over the substrate of a liquid crystal display device, a film formed at a defect portion is in contact with the substrate face in a limited area or a small area, thereby being susceptible to this problem. Further, the film itself often becomes cracked.

SUMMARY OF THE INVENTION

An object of the present invention, attempted in view of the problems noted above, is to provide a laser CVD device and a laser CVD method which can serve to tighten the adhesion of a film to the face on which the film is formed Another object of the invention is to provide a laser CVD device and a laser CVD method which can prevent cracks from occurring in the formed film itself.

A further object of the invention is provide a laser CVD device and a laser CVD method which are advantageous to be applied for correcting deficiencies in photomask patterns and deficiencies in wiring or insulating films of a liquid crystal display.

According to the present invention, there is provided a laser CVD device comprising: a plasma unit for turning pretreating gas into a plasma state in atmosphere and supplying a plasma gas to a substrate; means for radiating a laser beam to a deposition area on the substrate; means for supplying film forming gas to the deposition area; and means for sealing the film forming gas isolated from an external atmosphere, wherein the deposition area of the substrate is pretreated by the plasma unit and a film is formed over the deposition area of the substrate by activating the film forming gas by the laser beam.

According to the another aspect of the invention, there is provided a laser CVD method comprising steps of: turning pretreating gas into a plasma state by arc discharge; supplying the pretreating gas in the plasma state to bring it into contact with a film formation face of a substrate; supplying film forming gas to the film formation face of the substrate isolated from the external atmosphere; irradiating the film formation face of the substrate with a laser beam to activate the film forming gas; and causing the activated film forming gas to form a film over the film formation face of the substrate.

PREFERRED EMBODIMENTS OF THE INVENTION

Preferred embodiments of the present invention will be described below with reference to accompanying drawings.

Figure 1:
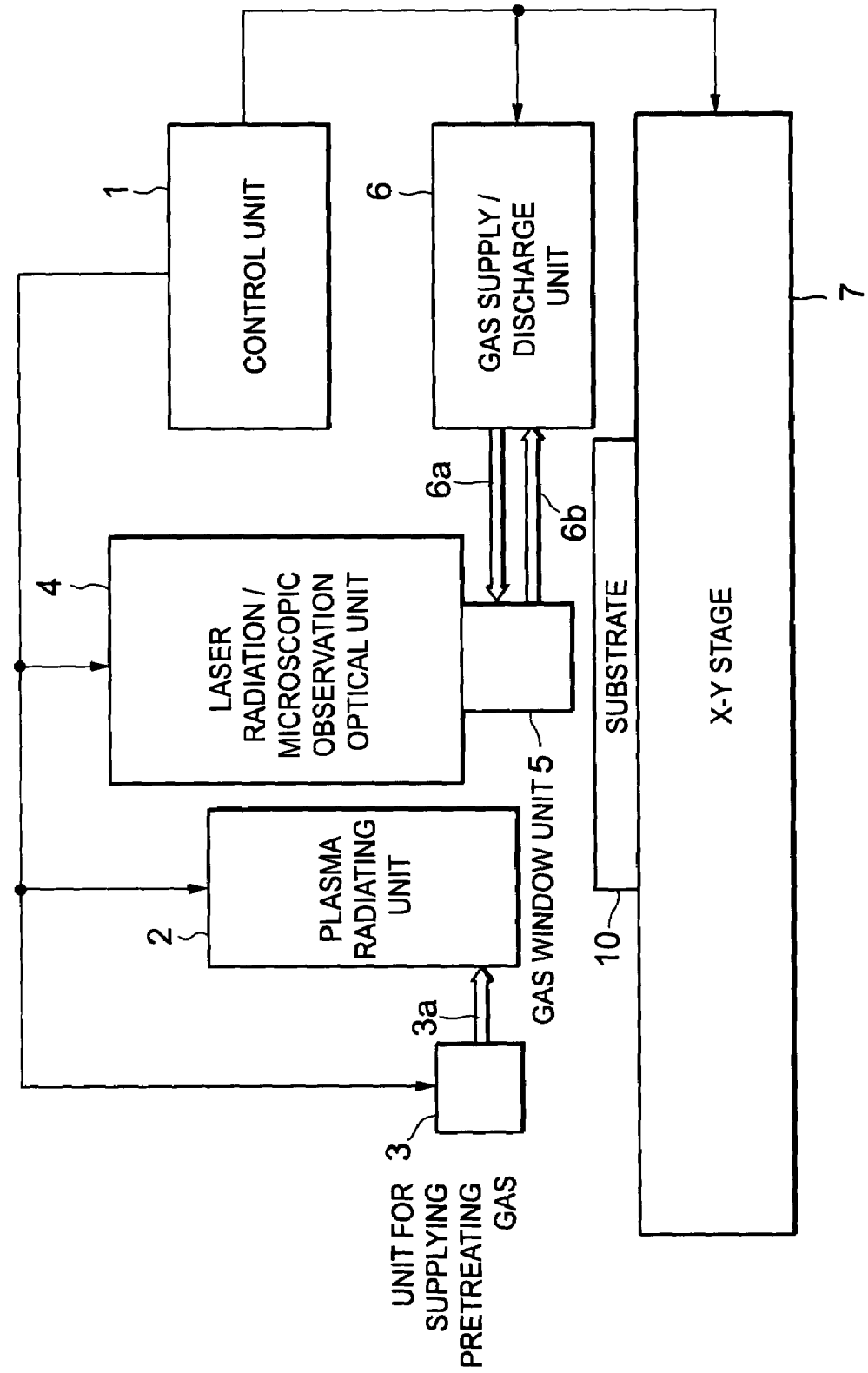
FIG. 1 shows a laser CVD device according to the invention, which is applied for a pattern defect correcting apparatus.

With reference to FIG. 1 showing the pattern defect correcting apparatus, which the laser CVD device of the invention is applied for, a plasma radiating unit 2 turns pre-treating gas into a plasma state by arc discharge and irradiates a surface of a substrate 10 with the plasma state gas. To this end, a gas supplying unit 3 supplies the pre-treating gas to the plasma radiating unit 2 via piping 3a. A laser radiation/microscopic observation optical unit 4 has a laser beam source and an optical system for observing the substrate surface with a microscope. A gas window unit 5 supplies film forming gas to the substrate 10 while isolating the substrate 10 from the external atmosphere. A gas supply/ discharge unit 6 supplies the forming gas and control gas for isolating the film formation face from the external atmosphere via piping 6a. The gas supply/discharge unit 6 also exhausts gas from the gas window unit 5 vi piping 6b. For constituting the pattern defect correcting apparatus, FIG. 1 further contains an X-Y stage (substrate holder) 7 on which the substrate 10 is mounted and the X-Y stage 7 can freely move within a plane The pattern defect correcting apparatus of FIG. 1 also has a control unit 1 for controlling the constituent elements to accomplish desired processing.

Figure 2:
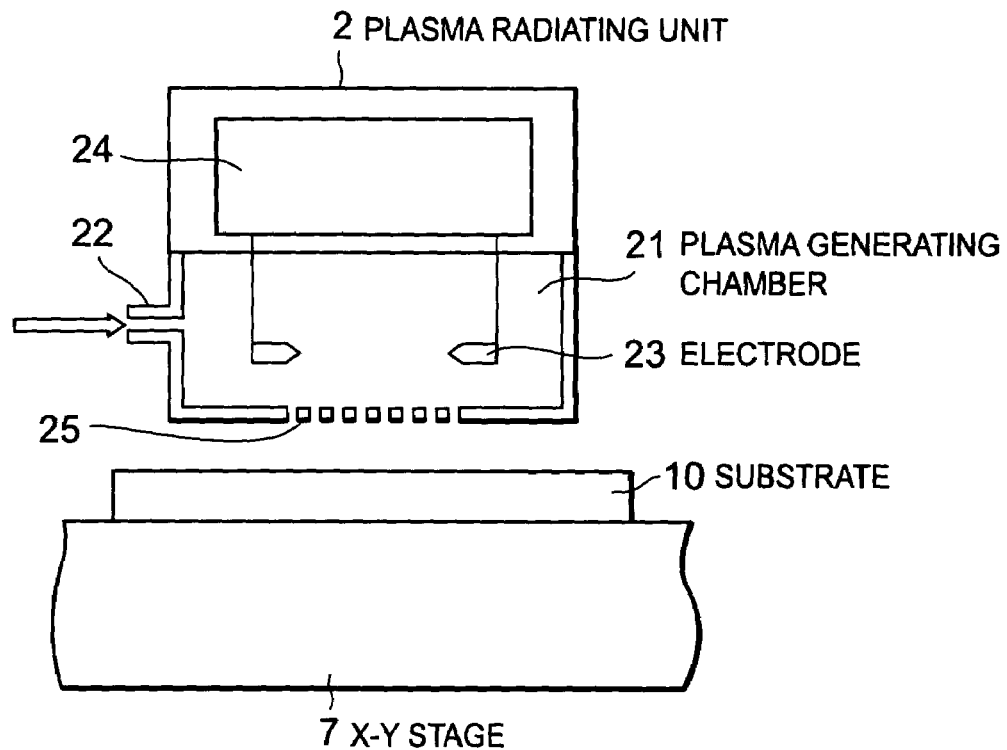
FIG. 2 shows a configuration of a plasma radiating unit constituting the laser CVD device of FIG. 1.

As shown in FIG. 2, the plasma radiating unit 2 has a plasma generating chamber 21, a gas inlet 22 for supplying pretreating gas to the plasma generating chamber 21, a pair of electrodes 23 for causing the pretreating gas to generate arc discharge, and a power source 24 for supplying discharge voltages to the pair of electrodes 23. Further, the gas outlet of the plasma generating chamber 21 is provided with a metal net 25 which has a plurality of gas discharge ports and has shielding function between the electrodes 23 and the substrate 10 for preventing arc discharge between the electrodes 23 and the substrate 10. As the pretreating gas, air, nitrogen, argon or the like is used.

Figure 3:
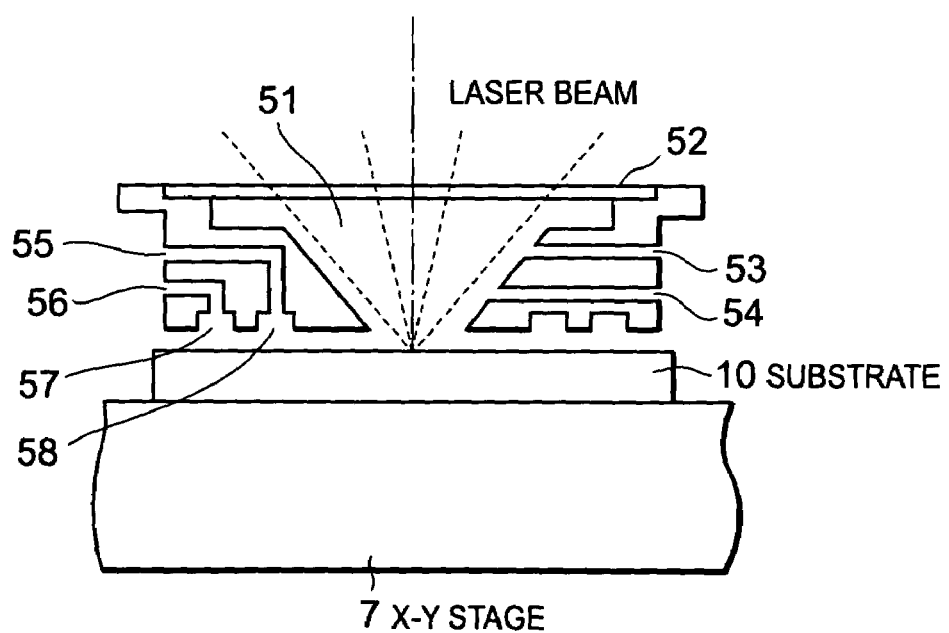
FIG. 3 shows a configuration of the gas window unit portion in the laser CVD unit shown in FIG. 1.

As shown in FIG. 3, the gas window unit 5 has a chamber 51 for sealing the film forming gas therein; a transparent partitioning wall 52 for partitioning a laser beam source and an optical system provided in the upper part of the chamber 51, from the chamber 51; a pressure detecting port 53 connecting to the chamber 51, for detecting the pressure in the chamber 51; a first intake/exhaust port 54 connecting to the chamber 51, for supplying the film forming gas into the chamber 51 or for reducing the pressure in the chamber 51; a second intake/exhaust port 55 connecting to an intake/exhaust groove 58 in the bottom face of the gas window unit 5 via a through hole, for supplying purging gas into the chamber 51 or for discharging the gas in the chamber 51 through a gap between the end face of the gas window unit 5 and the substrate 10; and a gas supply port 56 connecting to a gas supply groove 57 in the bottom face of the gas window unit 5 via a through hole, for supplying air-curtaining gas for shutting out the external atmosphere. As the film forming gas, $Cr(CO)_6$, $W(CO)_6$ or the like is used and, as purging gas and air-curtaining gas, inert gas such as $N_2$, Ar or He is used.

Before film formation, air-curtaining gas is supplied through the gas supply port 56 and purging gas is supplied through the second intake/exhaust port 55, respectively, and the chamber is discharged through the first intake/exhaust port 54. This causes the purging gas to be fed into the chamber 51 through the gap between the bottom face of the gas window unit 5 and the substrate 10, and the inside of the chamber 51 is filled with the purging gas.

When the film is to be formed, the air-curtaining gas is supplied through the gas supply port 56 and discharged through the second intake/exhaust port 55, and film forming gas is supplied into the chamber 51 through the first intake/exhaust port 54. This causes the film forming gas to pass from the bottom part of the chamber 51 to the second intake/exhaust groove 58 through the gap between the bottom face of the gas window unit 5 and the surface of the substrate 10. In this state, the surface of the substrate 10 is irradiated with a laser beam and the film forming gas is activated in isolation from the external atmosphere, thereby beginning a film formation.

Figure 4:
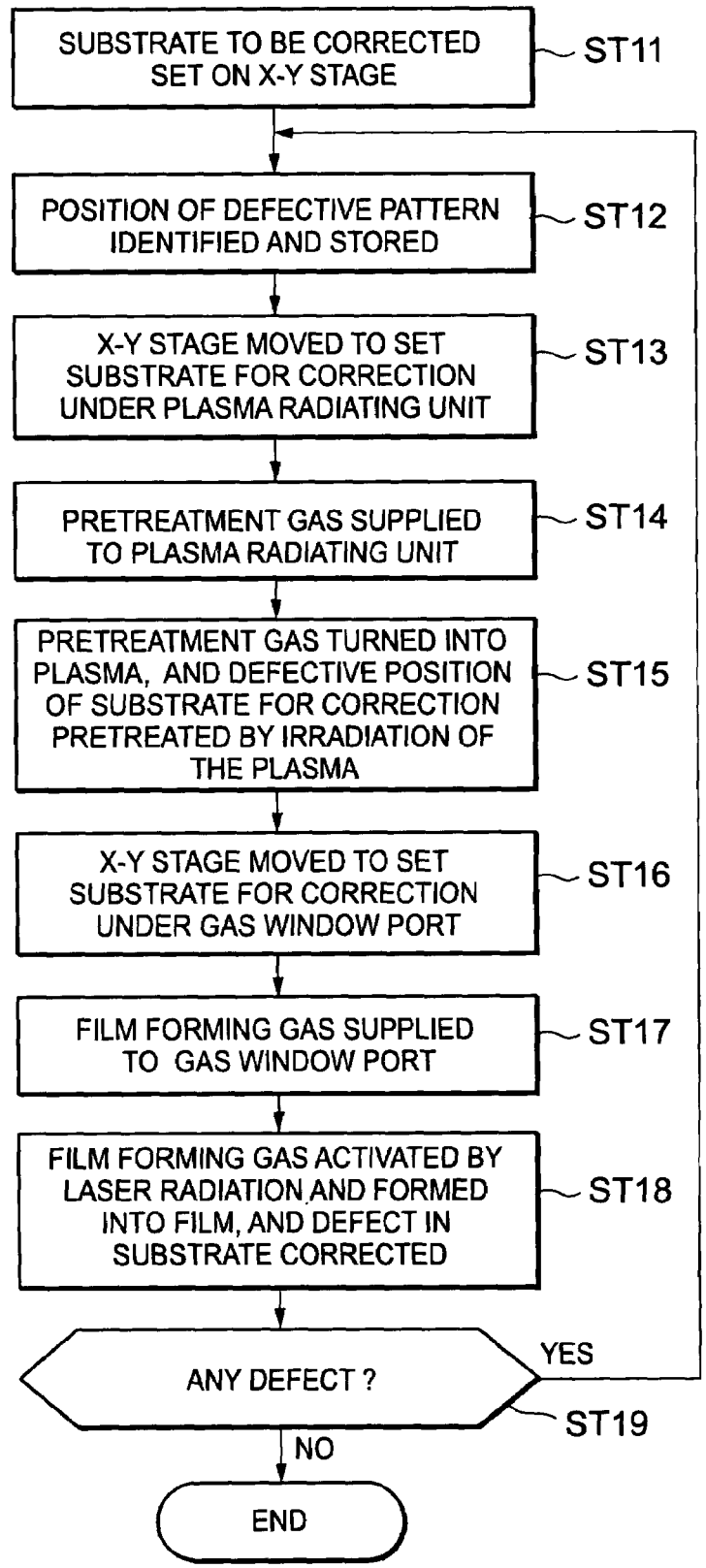
FIG. 4 is a flow chart for describing control steps for the pattern defect correcting apparatus shown in FIG. 1.

Next will be described the control steps for the pattern defect correcting apparatus with reference to FIG. 4. The control steps are controlled by control unit 1 shown in FIG. 1. Thus, first the substrate 10 is mounted on an X-Y stage 7 (step ST11 (FIG. 4));

(i) a first procedure to identify the position of the defect in the pattern on the substrate 10 and to store it into a memory in the control unit 1 is executed (step ST12);

(ii) a second procedure to move the substrate 10 to underneath the plasma radiating unit 2 by controlling the movement of the X-Y stage 7 holding the substrate 10 on the basis of positional information on the defect in the pattern is executed (step ST13);

(iii) a third procedure to supply pretreating gas to the plasma radiating unit 2 and turn it into plasma by arc discharge by controlling the plasma radiating unit 2 and the unit 3 for supplying the pretreating gas and to supply the pretreating gas in the plasma state to the substrate 10 is executed (step ST14);

(iv) a fourth procedure to pretreat the film formation face of the substrate 10 with the pretreating gas in the plasma state for a prescribed length of time is executed (step ST15);

(v) a fifth procedure to move the X-Y stage 7 holding the substrate 10 to the gas window unit 5 by controlling the movement of the X-Y stage 7 holding the substrate 10 is executed (step ST16);

(vi) a sixth procedure to supply film forming gas onto the substrate 10 isolated from the external atmosphere by controlling the gas window unit 5 and the gas supply/discharge unit 6 is executed (step ST17); and (vii) a seventh procedure to activate the film forming gas by irradiating a prescribed position of the substrate 10 with a laser beam and cause the activated film forming gas to form a film in a prescribed thickness in the prescribed position on the substrate 10 is executed (step ST18).

After that, it is checked whether or not there is any portion to be corrected (step ST19) and, if there is any, the process returns to step ST12 and repeats the same correcting sequence beginning with the procedure under (i).

Thus, according to the invention, the plasma pre-treating part including the plasma radiating unit 2 and the pretreating gas supplying unit 3 pretreats the film formation face of the substrate 10 with pretreating gas turned into the plasma state before a film is caused to be formed over the film formation face. Further, according to the invention, the film formation is performed in the atmosphere, and the plasma pre-treating part uses arc discharge that can turn the gas into a plasma state in the atmosphere, therefore, the whole sequence of processing from pretreatment to film formation can be accomplished in the atmosphere. This makes it possible, even in spite of today's tendency to prefer ever larger substrates, to prevent a laser CDV device and a pattern defect correcting apparatus from being enlarged correspondingly.

The control unit 1 causes the following procedure to be accomplished: the substrate 10 is moved as appropriate; the position of the defective pattern on the substrate 10 is identified and memorized; the plasma pre-treating part supplies pretreating gas, which is turned into a plasma state by arc discharge, and supplies the pretreating gas in the plasma state to the substrate 10 to cause the film formation face of the substrate 10 to be pretreated for a certain period; then the film forming operation is performed by the film forming part including the elements 4,5 and 6, in which film forming gas is isolated from the external atmosphere and supplied onto the substrate 10, and a laser beam is irradiated at a prescribed position on the substrate 10 and a film having a prescribed thickness is formed at the prescribed position on the substrate 10. According to the invention, since the plasma pre-treating and the film forming operation can be sequentially performed, strengthen adhesion between the film formed in the defective portion and the film formation face of the substrate 10 are completed, thereby automatically enabling the whole sequence from pretreatment to the correction of the defect in the pattern.

Next, adoption of the laser CVD device of the invention to a defect correcting process for a mask pattern will be described hereinafter with reference to FIGS. 5(a) and 5(b).

Figure 5A:
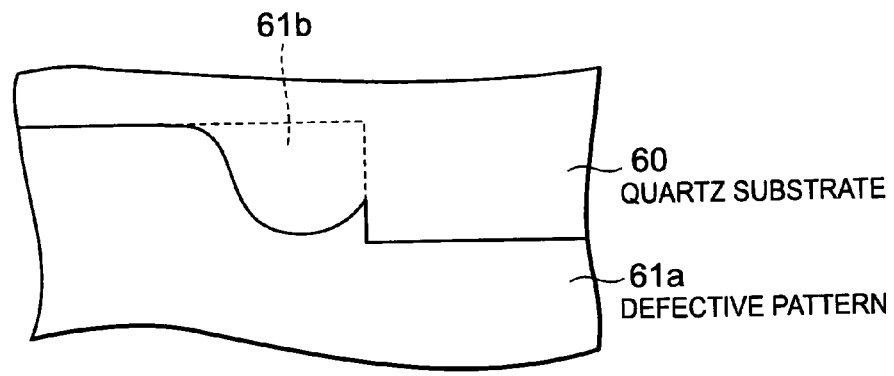
FIGS. 5(a) and 5(b) are plans for describing a defect correcting process for a mask pattern, consisting of a Cr film on a glass substrate, which is application of the present invention.

As shown in FIG. 5(a), a photomask consisting of a quartz substrate 60 on which a pattern 61a having a partial defect 61b is formed is mounted on the X-Y stage 7 of the pattern defect correcting apparatus, and fixed with a vacuum chuck or the like. Then, the X-Y stage 7 is moved so that the defective position come into the field of view of the laser radiation/microscopic observation optical unit 4 on the basis of the defect coordinate data of the photomask, and confirms the defect 61b of the pattern 61a. Next, the X-Y stage 7 is moved so that the defect 61b come right underneath the plasma radiating unit 2. Then, the unit 3 supplies the pretreating gas into the plasma radiating unit 2, and in the plasma radiating unit 2, a discharge voltage is supplied to the electrodes 23. This causes the pretreating gas to be turned into a plasma state by arc discharge, and the radicals of the pretreating gas to be supplied to and come into contact with the surface of the substrate 10 to carry out pretreatment. This state is sustained for about three seconds.

Then, under the control by the control unit 1, the X-Y stage 7 is moved so that the defect 61b of the pattern 61a come into the field of view of the laser radiation/microscopic observation optical unit 4 on the basis of the defect coordinate data of the photomask, and confirms the defect 61b. Next, the shape and position of irradiation with the laser beam is adjusted to make it possible to correct the defect. After this, the gas unit 6 supplies air-curtain gas, and the film forming gas consisting of Ar carrier gas containing $Cr(CO)_6$ into the gas window unit 5 at a flow rate of 600 sccm. In this way, the film forming gas is supplied onto the surface of the substrate 10 underneath the gas window unit 5 in a state isolated from the external atmosphere by the air-curtain gas. In this process, the gas supply/discharge rate is adjusted so as to keep the gas pressure in the laser-irradiated portion to be 0.3 Torr.

Next, a laser beam is irradiated at the defect on the surface of the substrate 10. In this process, the laser-irradiated area is set to be 20 $\mu m^2$, and half of the irradiating beam is superposed over the Cr pattern to form a film sequentially. The laser beam to be used is one of a third harmonic of Qsw-Nd:YAG laser (355 nm in wavelength, 40 ns in pulse width and 8 kHz in repetition frequency), and the duration of irradiation with the laser is 1.3 seconds. This resulted in the formation of a Cr film 61c over the defect 61b to correct the defective pattern as shown in FIG. 5(b).

The Cr film formed as described above is evaluated with respect to shape, separation and cracking. For comparison, another Cr film which is conventionally formed without the plasma pretreatment is also evaluated similarly. In checking both films, the intensity of laser radiation is used as the parameter. In the evaluation of the film shape, if the CVD Cr film 61c had grown from the Cr pattern in conformity with the radiated laser pattern, the shape is considered satisfactory. In that of film separation, if any partial or complete stripping-off had occurred in the patterned portion of the glass portion of the CVD Cr film 61c, it is considered faulty. In that of cracking, any crack in part or the whole of the CVD Cr film 61c is considered faulty.

The results of checking are shown in Table 1.

TABLE 1

| Laser power (mW) | Not pretreated | | | Pretreated | | |
|---|---|---|---|---|---|---|
| | Shape | Separation | Cracking | Shape | Separation | Cracking |
| 2.4 | X | X | O | O | O | O |
| 2.6 | X | X | O | O | O | O |
| 2.8 | X | O | O | O | O | O |
| 3.0 | O | O | O | O | O | O |
| 3.2 | O | O | X | O | O | O |
| 3.4 | O | X | X | O | O | O |
| 3.6 | O | X | X | O | O | X |

As is seen from Table 1, it is found that the plasma pretreatment can accelerate film growth and substantially reduce the likelihood of separation and cracking. It is further found that according to the invention, the acceptable range of the intensity of laser radiation, which is applied for forming the CVD Cr film 61c, is about four times as wide as the CVD Cr film formed without the plasma pretreatment. Moreover, the surface of the formed CVD Cr film 61c is made smoother, and the uniformity of light interception is enhanced.

These significant effects are presumably due to the activation of the surface of the substrate 10 by the plasma pretreatment and the ensuing facilitation of the absorption of the film forming gas, and the retention of these effects, resulting in the stabilization of the formed film even if the film is exposed to the atmosphere for some time after the plasma pretreatment, and to the strengthened tightness of the adhesion of the CVD Cr film 61c to the substrate 10 resulting from the film formation on the activated surface. It is further presumable that the pretreatment has effects to remove moisture, oil and fat sticking on the substrate 10 and to expose a clear surface, thereby contributing the improved film formation.

Figure 5B:
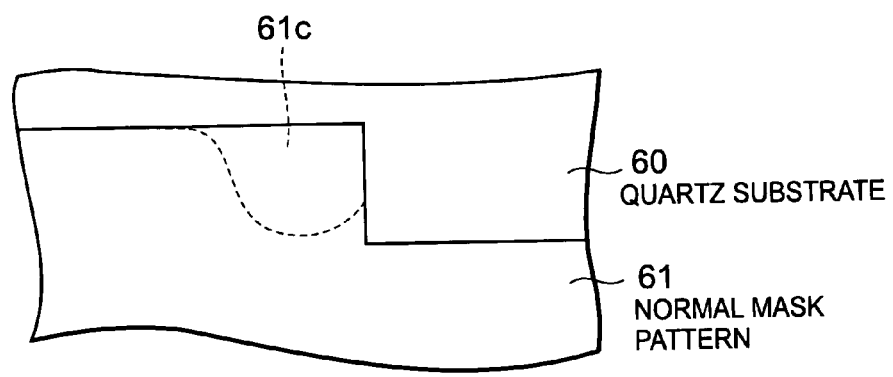

Thus according to the pattern defect correcting process shown in FIG. 5(b), pretreating gas turned into the plasma state by arc discharge is brought into contact with a defective portion of the pattern on the substrate 10 to pretreat it before a corrected pattern is formed in that defective portion of the pattern to reform the film formation face, and the effect of that treatment is sustained. As a result, even if the film formation face is exposed to the atmosphere before film formation after the pretreatment of the film formation face, the CVD Cr film 61c formed over the film formation face can be prevented from stripping off. The adhesion of the CVD Cr film 61c formed over a defect 61b where there are many portions of the film formation face which are small in contact area to the film formation face of the substrate 10 can be tightened with particular effectiveness.

The film formation face of substrate 10 is pretreated with pretreating gas turned into a plasma state by arc discharge, and a film is formed over the film formation face of the substrate 10 in an state of isolation from the external atmosphere with film forming gas activated by a laser beam. Therefore, the full sequence after the pretreatment until the film formation can be carried out in the atmosphere. For this reason, even if the substrate 10 is increased in size, the apparatus for implementing this method can be kept unchanged in size, and at the same time the throughput can be increased.

Figure 6A:
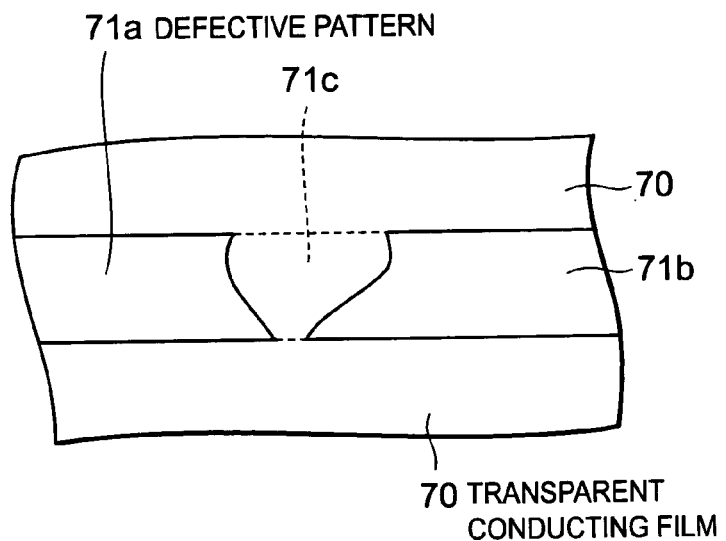
FIGS. 6(a) and 6(b) are plans for describing a correction process for disconnecting defects in a wiring pattern formed on a liquid crystal substrate, which is also application of the present invention.
Figure 6B:
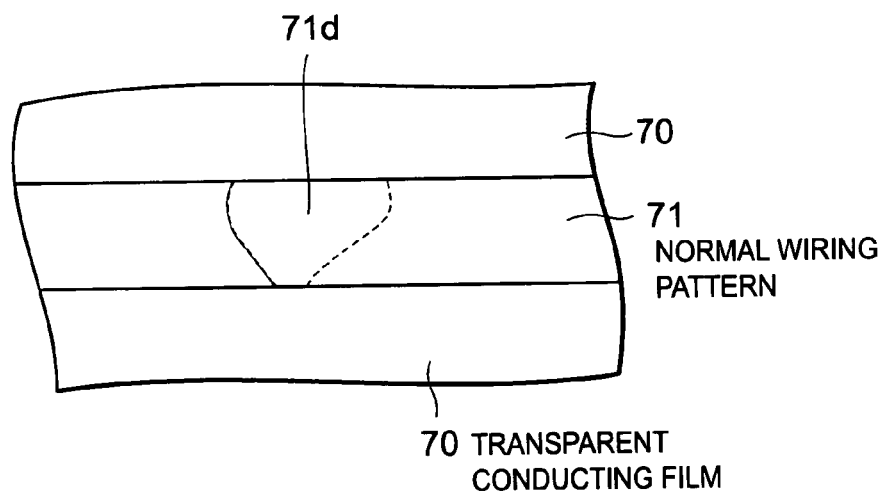
Figure 7A:
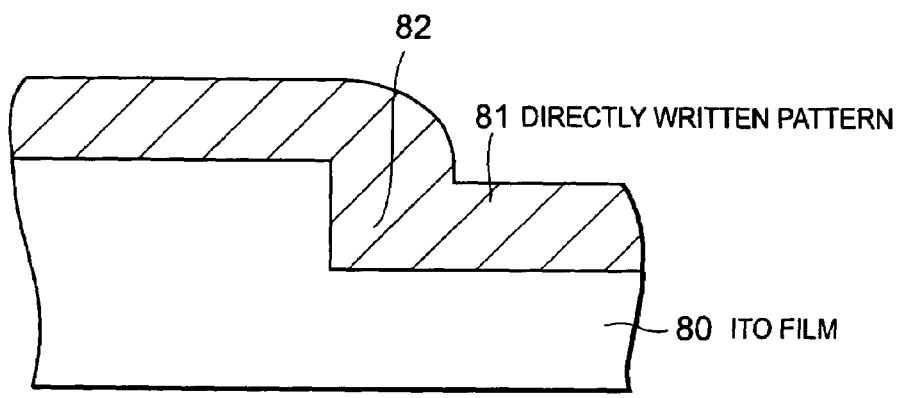
FIGS. 7(a) and 7(b) are sections which comparatively show states of film formation at a step area of a transparent conducting film (ITO film), between the prior art and the present invention.

FIGS. 6(a) and 6(b) are plans for describing a correction process for correcting disconnecting defects in a wiring pattern formed on a liquid crystal substrate, and FIGS. 7(a)

and 7(b) are sections which comparatively show the states of film formation at a step of a transparent conducting film (ITO film). The pattern defect correcting process will be described below with reference to FIGS. 6(a) and 6(b) and FIGS. 7(a) and 7(b). This pattern defect correcting process is performed by the defect correcting apparatus shown in FIG. 1.

First is prepared a liquid crystal substrate consisting of a glass substrate over which thin film transistors are arranged in a matrix form and a grid of wiring consisting of a tungsten (W) film is formed. Wiring lines 71a and 71b are formed over a transparent conducting film (ITO film) 70, and are partly defective and broken. Next, the liquid crystal substrate is mounted on the X-Y stage 7 of the pattern defect correcting device, fixed with a vacuum chuck or the like and, through the same process as in the second mode of implementation, normal wiring 71 can be realized by forming a CVDW film to correct a defective portion 71c in defective patterns 71a and 71b as shown in FIG. 6(b).

In this case, the conditions of plasma pretreatment are set to be the same as the case shown in FIG. 5(b).

On the other hand, regarding the conditions of laser CVD, $W(CO)_6$ is used as the film forming gas at a flow rate of 50 to 100 sccm, and the gas pressure in the laser-irradiated portion during film formation is set to be 0.5 Torr. The applied laser beam is one of a third harmonic of Qsw-Nd:YAG laser (355 nm in wavelength, 60 ns in pulse width and 5 kHz in repetition frequency). The laser-irradiated area was set to be 4 $\mu M^2$, and the laser radiation power, 3 mW. The moving speed of the X-Y stage during film formation was 5 $\mu m/s$.

Figure 7B:
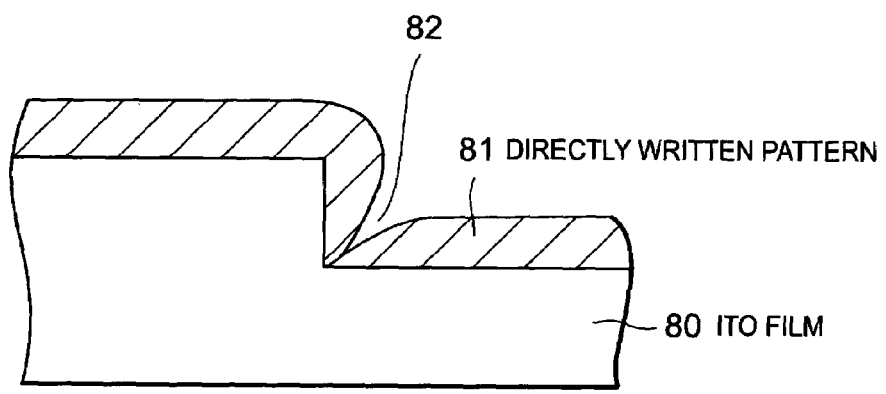

Regarding the above process shown in FIG. 6(b) and FIG. 7(a), a study is made on differences in the state of film formation with the performance or non-performance of the plasma pretreatment, the choice of the material for the film formation face (ITO or SiN) and the shape of the film formation face (the presence or absence of a step). According to the findings, where no plasma pretreatment is performed, when the base is a SiN film, a W film of 200 nm in thickness grew, and when the base was an ITO film, a W film of 100 nm in thickness did not grow. In the both cases, the growth of the CVD film in the direct writing direction tended to be slow. As a result, interruption of a directly written pattern 81a on the step portion 82 of an ITO film 80 occurred at a frequency of about 10% as shown in FIG. 7(b). In view of this problem, the direct writing speed was slowed down to 3 $\mu m/s$, the breakage of the directly written pattern 81 is prevented, but a new problem arose, that is a drop in the throughput of correction.

On the other hand, in the case where the plasma pretreatment is applied according to the present invention, whether the base is an SiN film or an ITO film, nodefference occurs in film thickness, and the film thickness increases to 300 nm. Moreover, no breakage of the directly written pattern 81 arises in the step portion 82 as shown in FIG. 7(a). Even when the direct writing speed is raised to 7 $\mu m/s$, stable direct writing is achieved at a film thickness of 200 nm.

When a defective breakage in the pattern over a liquid crystal substrate is to be corrected, the drop in throughput which the plasma pretreatment entailed is successfully restrained within a practically acceptable extent by contriving a procedure in which defects is successively corrected beginning with mutually close positions after subjecting these mutually close defects to plasma pretreatment in the same sequence before correction is carried out by CVD film formation. The resultant throughput is as high as 1.5 times that in the absence of plasma pretreatment and, moreover, a yield of 100% is achieved.

While the embodiment of the present has been described in detail with reference to the accompanying drawings, specific configurations of the invention are not limited to these embodiments, but the invention will also cover modifications in design or other aspects within the true scope and spirit of the invention. For instance, though the above-described embodiment use at least one of air, nitrogen or inert gas as the pretreating gas, the choice is not limited to these.

Although either $Cr(CO)_6$ or $W(CO)_6$ is used as the film forming gas, again the choice is not restricted to them.

Further, the choice of the plasma radiating unit is not limited to what is used in the first preferred embodiment. Any plasma radiating unit having a configuration to permit plasma generation by arc discharge can be used.

Nor is the laser CVD unit limited to what is used in the first embodiment.

Any laser CVD unit having a configuration to permit film formation in the atmosphere would be acceptable.

According to the present invention, by performing the film formation face by pretreating it with the pretreating gas in the plasma state, even if the film formation face is exposed to the atmosphere after the plasma pretreatment before film formation, the film formed on the film formation face can be prevented from stripping off. Moreover, since the arc discharge is applied, the pretreating gas into the plasma state can be turned in the atmosphere. Therefore, the full sequence from the pretreatment to the film formation can be accomplished in the atmosphere. This makes it possible, even in spite of today's tendency to prefer ever larger substrates, to prevent apparatus from being enlarged correspondingly.

Also according to the invention, a compact pattern defect correcting apparatus capable of tightening the adhesion of the film formed in a defective portion to the film formation face of the substrate and automatically carrying out the full sequence from the pretreatment to the correction of defects can be provided.

Further, according to the invention, the film formation face can be performed by pretreating the film formation face with pretreating gas, and the effects of this treatment is be well sustained. For this reason, even if the film formation face is exposed to the atmosphere after the pretreatment before film formation, the film formed over the film formation face can be prevented from stripping off. Furthermore, since the full sequence from the pretreatment to the film formation can be accomplished in the atmosphere, the throughput can be enhanced.

Also, according to the invention, before a corrected pattern is formed in a defective portion of the pattern over the substrate, pretreating gas turned into a plasma state by arc discharge is brought into contact with the defective portion of the pattern over the substrate to pretreat that portion.

Accordingly, the adhesion of a film formed over a defect where there are many portions of the film formation face which are small in contact area to the film formation face of the substrate can be tightened with particular effectiveness, and thereby to prevent the film from stripping off.

What is claimed is:
1. A laser CVD device comprising:
a plasma unit for turning pretreating gas into a plasma state in atmosphere via arc discharge and supplying a plasma gas to a substrate, wherein said plasma unit includes a plasma generating chamber, a gas inlet for receiving pretreating gas to the plasma generating chamber, and an electrode for causing the pretreating gas to generate arc discharge, and a metal net for preventing the arc discharge from being effected on the substrate;

means for radiating a laser beam to a deposition area on the substrate;

means for supplying film forming gas to the deposition area; and means for sealing the film forming gas isolated from an external atmosphere, wherein the deposition area of said substrate is pretreated by said plasma unit supplying the plasma gas to the substrate prior to a film formed by CVD over said deposition area of said substrate by activating the film forming gas by said laser beam.

2. A laser CVD device comprising:

a plasma unit for turning pretreating gas into a plasma state and supplying a plasma gas to a substrate, wherein the pretreating gas is air;

wherein said plasma unit makes the plasma state by arc discharge;

wherein said plasma unit includes a plasma generating chamber, a gas inlet for receiving pretreating gas to the plasma generating chamber, and an electrode for causing the pretreating gas to generate arc discharge;

wherein said plasma unit further includes a metal net for preventing the arc discharge from being effected on the substrate;

means for radiating a laser beam to a deposition area on the substrate;

means for supplying film forming gas to the deposition area; and means for sealing the film forming gas isolated from an external atmosphere, wherein the deposition area of said substrate is pretreated by said plasma unit supplying the plasma gas to the substrate prior to a film formed by CVD over said deposition area of said substrate by activating the film forming gas by said laser beam.

* * * * *